(12) United States Patent
Schelling

(10) Patent No.: US 9,394,158 B2
(45) Date of Patent: Jul. 19, 2016

(54) MICROMECHANICAL ACCELERATION SENSOR HAVING CONDUCTOR TRACKS AND CAVITIES

(71) Applicant: Robert Bosch GmbH, Stuttgart (DE)

(72) Inventor: Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/949,291

(22) Filed: Jul. 24, 2013

(65) Prior Publication Data

US 2014/0264649 A1 Sep. 18, 2014

(30) Foreign Application Priority Data

Jul. 30, 2012 (DE) .......................... 10 2012 213 313

(51) Int. Cl.
| | |
|---|---|
| B81B 3/00 | (2006.01) |
| B81B 7/00 | (2006.01) |
| B81C 1/00 | (2006.01) |
| G01C 19/5733 | (2012.01) |
| G01P 15/08 | (2006.01) |
| G01P 15/125 | (2006.01) |
| G01C 19/5769 | (2012.01) |

(52) U.S. Cl.
CPC .............. *B81B 3/0021* (2013.01); *B81B 7/008* (2013.01); *B81C 1/0019* (2013.01); *B81C 1/00246* (2013.01); *G01C 19/5733* (2013.01); *G01C 19/5769* (2013.01); *G01P 15/0802* (2013.01); *G01P 15/125* (2013.01); *B81B 2201/0228* (2013.01); *B81B 2201/0235* (2013.01); *B81B 2207/015* (2013.01); *B81C 2203/0714* (2013.01)

(58) Field of Classification Search
CPC .............. B81B 2201/0028; B81B 2201/0235; B81B 2207/015; B81B 3/0021; B81B 3/0027; B81C 1/00246; B81C 1/0019; B81C 1/0015; B81C 1/00166; B81C 1/00174; B81C 2203/0714
USPC ........................................................ 438/50, 52
See application file for complete search history.

(56) References Cited

U.S. PATENT DOCUMENTS

| | | | |
|---|---|---|---|
| 6,012,336 A * | 1/2000 | Eaton et al. ...................... 73/754 |
| 6,930,367 B2 * | 8/2005 | Lutz et al. ...................... 257/417 |
| 7,540,199 B2 * | 6/2009 | Fujii et al. ....................... 73/780 |
| 7,690,255 B2 * | 4/2010 | Gogoi et al. ............... 73/514.32 |
| 2004/0248344 A1 * | 12/2004 | Partridge et al. ............... 438/127 |
| 2005/0095813 A1 | 5/2005 | Zhu et al. |
| 2006/0180883 A1 * | 8/2006 | Kouma et al. .................. 257/415 |
| 2007/0190680 A1 * | 8/2007 | Fukuda et al. ................... 438/50 |
| 2009/0179233 A1 | 7/2009 | Lee et al. |
| 2010/0295138 A1 | 11/2010 | Montanya Silvestre et al. |
| 2010/0330722 A1 | 12/2010 | Hsieh et al. |
| 2011/0089503 A1 * | 4/2011 | Fujita et al. ..................... 257/415 |
| 2011/0104844 A1 | 5/2011 | Hsieh et al. |
| 2011/0265574 A1 | 11/2011 | Yang |
| 2012/0038372 A1 | 2/2012 | Reinmuth et al. |
| 2013/0181302 A1 * | 7/2013 | Giroud et al. .................. 257/415 |

\* cited by examiner

*Primary Examiner* — Kevin Parendo
(74) *Attorney, Agent, or Firm* — Maginot, Moore & Beck LLP

(57) ABSTRACT

A micromechanical structure includes a substrate, a micromechanical functional structure, and a conductor track arrangement. The substrate has a top side, and the micromechanical functional structure is formed in the substrate on the top side. The conductor track arrangement is formed above the top side of the substrate, and the conductor track arrangement includes at least two insulation layers of non-conductive material and a conductor track layer of conductive material located between the at least two insulation layers.

9 Claims, 4 Drawing Sheets

(B-B')

(A-A')

(B-B')

(B-B')

(B-B')

(B-B')

(B-B')

(B-B')

MICROMECHANICAL ACCELERATION SENSOR HAVING CONDUCTOR TRACKS AND CAVITIES

This application claims priority under 35 U.S.C. §119 to patent application no. DE 10 1012 213 313.5, filed on Jul. 30, 2012 in Germany, the disclosure of which is incorporated herein by reference in its entirety.

The present disclosure relates to a micromechanical structure and to a corresponding production process.

BACKGROUND

US2010/0295138 A1 and US2005/0095813 A1 have disclosed micromechanical (MEMS) structures which use CMOS layers to realize micromechanical functions.

US2011/0265574 A1 discloses a process for the back-end integration of MEMS functions on a CMOS circuit.

SUMMARY

The present disclosure provides a micromechanical structure according to the description below and a corresponding production process according to the description below. Preferred refinements form the subject matter of the description below.

The concept on which the present disclosure is based consists in providing a CMOS-MEMS structure using layers that have been patterned out of a substrate and CMOS layers.

The micromechanical structure according to the disclosure and the corresponding production process allow the use of stable substrate material to produce the micromechanical functional structure, with the result that there is no need for expensive deposition or expensive transfer bonding of thick micromechanical functional layers. An additional benefit is the utilization of the flexibility of existing CMOS processes for the conductor track arrangement and any CMOS circuits.

According to a preferred embodiment, a cavity is located between a top passivation layer and the top side of the substrate. It is in this way possible to set a defined atmosphere and pressure for the micromechanical functional structure.

According to a further preferred embodiment, the cavity is laterally delimited by a stacked sequence of conductor track layers and through-contacts located between them. This allows controlled stopping of the vapor phase etching process in the lateral direction.

According to a further preferred embodiment, the micromechanical functional structure is bridged by a conductor track arrangement having at least one conductor track which is laterally anchored to the stacked sequence. A stable conductor track arrangement can be achieved in this way.

According to a further preferred embodiment, the cavity is closed off by a closure layer. It is in this way possible to set any desired pressures in the cavity.

According to a further preferred embodiment, the micromechanical functional structure has a deflectable mass device. This allows the production of a robust inertial sensor, e.g. an acceleration sensor or a rotation rate sensor.

According to another preferred embodiment, one or more blocks of the insulation layers surrounded by conductive material are arranged on the mass device. In this way, it is possible to increase the mass area density.

According to another preferred embodiment, a further cavity is provided in the substrate below the micromechanical functional structure. It is in this way possible to form electrically insulated and/or deflectable or movable functional structures.

According to another preferred embodiment, the substrate is a single-crystal silicon substrate or a single-crystal SOI substrate. Single-crystal silicon, unlike the CMOS layers of the conductor track arrangement LB, has very well-defined mechanical properties. Moreover, on account of its low surface roughness compared to polysilicon, it has an increased breaking strength and therefore a higher reliability. In addition, with single-crystal material, unlike polycrystalline material/materials of the CMOS layers, layer stresses or stress gradients and different coefficients of thermal expansion are not a factor.

BRIEF DESCRIPTION OF THE DRAWINGS

The present disclosure is explained in more detail below on the basis of the exemplary embodiments shown in the schematic figures of the drawings, in which:

FIG. 1 a)-c) show schematic illustrations of a micromechanical structure according to a first embodiment of the present invention; specifically, FIG. 1a in horizontal section, FIG. 1b in vertical section on line A-A' in FIG. 1a and FIG. 1c in vertical section on line B-B' in FIG. 1a;

FIG. 2a)-d) show schematic illustrations explaining a process for producing the micromechanical structure according to a first embodiment of the present disclosure in vertical section on line B-B' in FIG. 1a; and FIG. 3 shows a schematic illustration of a micromechanical structure according to a second embodiment of the present disclosure in vertical section on line B-B' in FIG. 1a.

DETAILED DESCRIPTION

In the figures, identical reference symbols denote identical or functionally equivalent components.

Figure 1A:
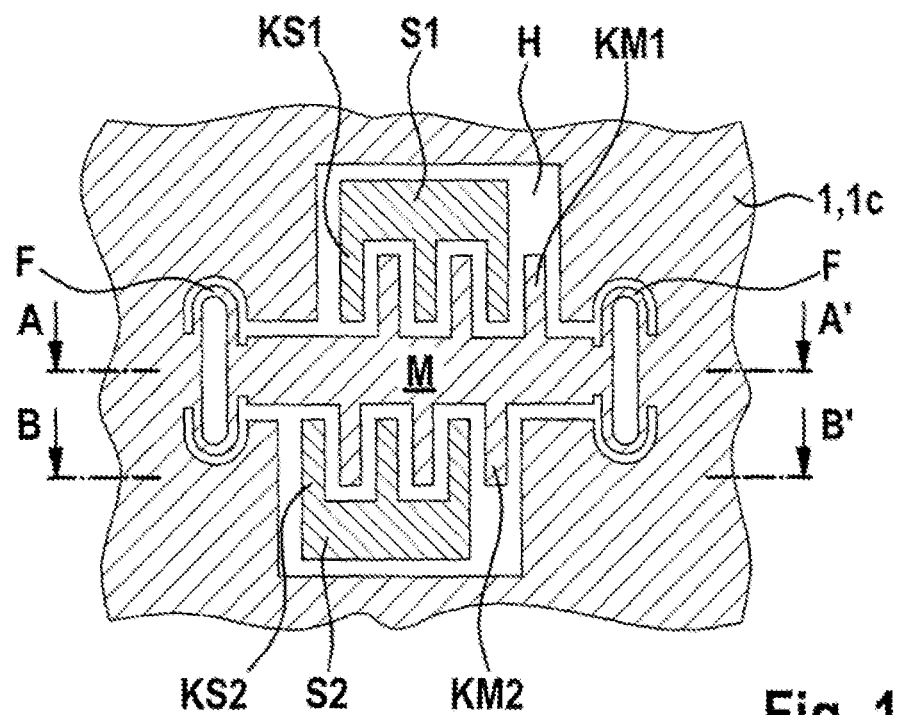

FIG. 1a)-c) are schematic illustrations of a micromechanical structure according to a first embodiment of the present disclosure; FIG. 1a in horizontal section, FIG. 1b in vertical section on line A-A' in FIG. 1a and FIG. 1b in vertical section on line B-B' in FIG. 1a.

Without representing any restriction, embodiments of the present disclosure are explained on the basis of a micromechanical structure in the form of an acceleration sensor.

In FIG. 1a), reference symbol 1 denotes a substrate made from single-crystal silicon having a top side OS. Alternatively, it is also possible, for example, to use an SOI substrate (see statements below with reference to FIG. 3).

By means of a two-stage etching process, which is explained in more detail below with reference to FIG. 2a)-d), a movable or deflectable mass device M, which is attached movably via spring elements F to the surrounding substrate 1, is patterned on the top side OS in the substrate 1. On opposite sides, the mass device M has a first comb structure KM1 and a second comb structure KM2. Also patterned on the top side OS in the substrate 1 are a first stator structure S1 having a third comb structure KS1 and a second stator structure S2 having a fourth comb structure KS2.

The first comb structure KM1 is interdigitated with the third comb structure KS1, and the second comb structure KM2 is interdigitated with the fourth comb structure KS2.

A known capacitor structure of this type can be used to electrically detect accelerations by means of capacitance changes in the event of deflection of the movable mass device M.

Figure 1B:
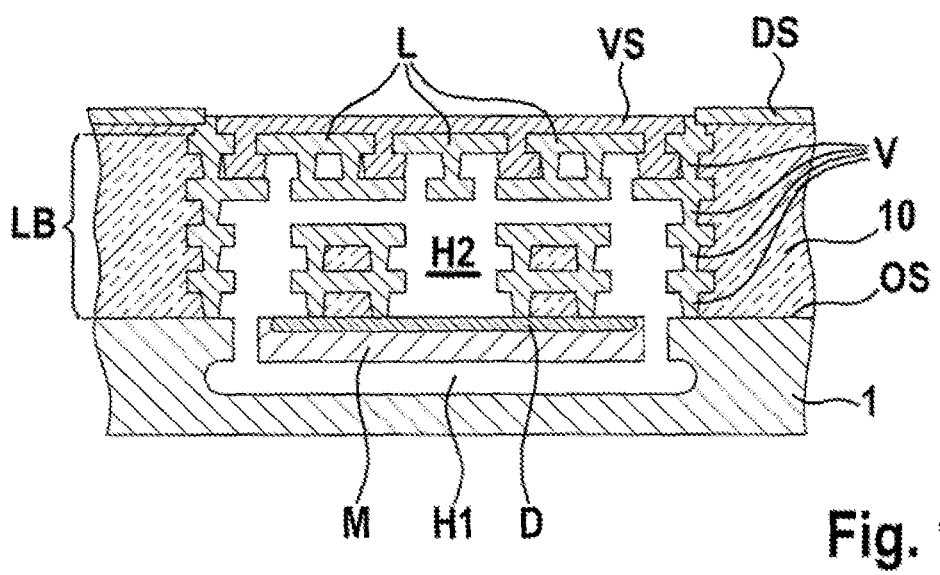

As illustrated in FIG. 1b), on the top side OS of the substrate 1 there is a doped region D both on the movable mass device M and on the comb structures KM1, KM2, KS1, KS2 and also in regions in the surrounding substrate 1, which doped region forms conductor tracks and is electrically contactable in order to pick up sensor signals.

On the top side OS of the substrate and of the doped region D are formed on four levels or in four conductor track layers L of conductive material, wherein adjacent levels are in each case electrically connected via through-contacts V. In this way, a multilayer conductor track arrangement LB is formed above the micromechanical functional structure comprising the mass device M, the spring elements F and the stator electrodes S1, S2.

A first cavity H1, which is provided below and to the sides of the micromechanical functional structure M, F, S1, S2, is connected to a second cavity H2 to form a combined cavity which is provided above the micromechanical functional structure M, F, S1, S2 inside the conductor track arrangement LB and the stacked sequence VB, in order in this way to form a joint cavity H1, H2.

Reference numeral 10 denotes insulation layers (indicated in hatched form in FIG. 1a)-c)), in which the conductor track arrangement LB and the through-contacts V are formed.

At the lateral boundaries of the cavity H2, the through-contacts V are formed above one another with conductor track layers L between them, in such a manner that the cavity H2 is in this way delimited by a ring all the way around it. In other words, the cavity H2 is laterally delimited by a stacked sequence VB of conductor track layers L and through-contacts V between them. The conductor track arrangement LB bridging the micromechanical functional structure is laterally attached to the stacked sequence VB.

Above the insulation layer 10, a capping layer DS, for example a nitride or carbide layer, is formed in the periphery of the stacked sequence VB. The second cavity H2 is optionally closed off on its top side by a closure layer VS, which for example likewise consists of oxide, nitride, carbide or a metallization. In this way, a predetermined atmosphere can be established in the joint cavity H1, H2.

One or more blocks B1, B2 of the insulation layers 10 surrounded by conductive material are arranged on the mass device M. In the case of the inertial sensors, a higher inert mass of the mass device M may be advantageous for the signal level. Therefore, to increase the inert mass area density, these metal-clad blocks B1, B2 from the dielectric CMOS layers are provided on the inert mass device M.

The micromechanical structure in the form of an acceleration sensor formed in this way therefore comprises mechanically well-defined, robust, single-crystal silicon in the micromechanical functional region M, F, S1, S2. There is therefore no or only a slight dependency on (thermo)mechanical stresses in the CMOS layers of the conductor track arrangement LB. Furthermore, there is no need for expensive deposition or transfer bonding of thick micromechanical functional layers, for example of polysilicon with a thickness of 10 to 20 μm.

Furthermore, the single-crystal silicon substrate 1 allows the production of thicker functional layers with a higher mass area density, so that a better sensor signal can be obtained. By increasing the vertical etch depth, the mass area density can be increased to almost any desired extent in an area-neutral manner, so that either the signal can be increased without increasing the area or, if the signal level remains the same, the area can be reduced and therefore the corresponding chip can be manufactured at lower cost.

Compared to the CMOS layers of the conductor track arrangement LB, single-crystal silicon has very well-defined mechanical properties. On account of its low surface roughness compared to polysilicon, moreover, it has a high breaking strength and therefore a greater reliability. An additional factor is that with single crystal material there are no layer stresses or stress gradients, unlike the polycrystalline material/materials of the CMOS layers.

Furthermore, realizing the micromechanical functional region M, F, S1, S2 in the substrate 1 has the advantage that the top side OS remains planar, allowing monolithic integration with a CMOS circuit arrangement (not shown).

The through-contacts V used to form the stacked sequence VB having the through-contacts V and the conductor track layers L make it possible to laterally delimit the cavity H2 (cf. FIG. 2a)-d)). The shorter vapor phase etching time is derived from the metallization acting as an etch stop during the vapor phase etching, for example by means of HF.

The partial filling of the cavity with metal-clad oxide blocks and conductor tracks not only shortens the vapor phase etching time but at the same time also allows a stable closure layer VS to be applied.

Figure 2A:
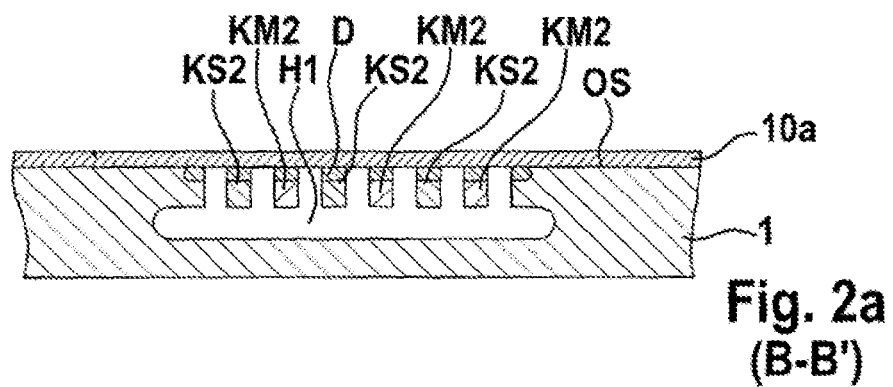

FIG. 2a)-d) are schematic illustrations explaining a process for producing the micromechanical structure according to a first embodiment of the present disclosure in vertical section on line B-B' in FIG. 1a.

As illustrated in FIG. 2a), first of all, in a two-stage etching process using an etching mask layer 10a with access holes (not shown), in a first, anisotropic etching step a vertical etch is carried out to define the thickness of the micromechanical functional structure M, F, S1, S2, with the doping region D having previously been created for example by implantation. Then, in a second etching step, the micromechanical functional structure M, F, S1, S2 is isotropically under-etched to form the cavity H1 and to make the mass device M movable or deflectable.

By means of contour-encircling etching in the first anisotropic etching step and under-etching in the second isotropic etching step, it is in this way possible to produce structures that are electrically insulated from the substrate 1, for example the stator electrodes S1, S2. Mechanical attachment is effected by way of polysilicon and/or metal layers.

After the formation of the micromechanical functional region M, F, S1, S2 has ended, the access holes (not shown) are closed up, for example by deposition of a further thin oxide layer, after which the CMOS layers are deposited and patterned to form the conductor track arrangement LB having the through-contacts V and the oxide layers 10 between them.

Figure 2B:
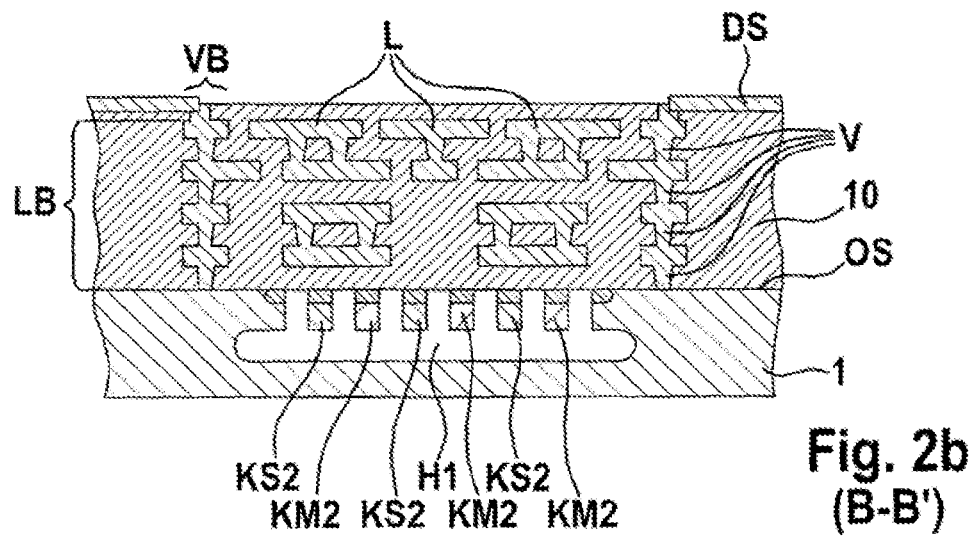

After the conductor track arrangement LB has been completed, a capping layer DS is deposited and patterned, as shown in FIG. 2b), in such a way that it ends at the through-contact boundary VB.

Figure 2C:
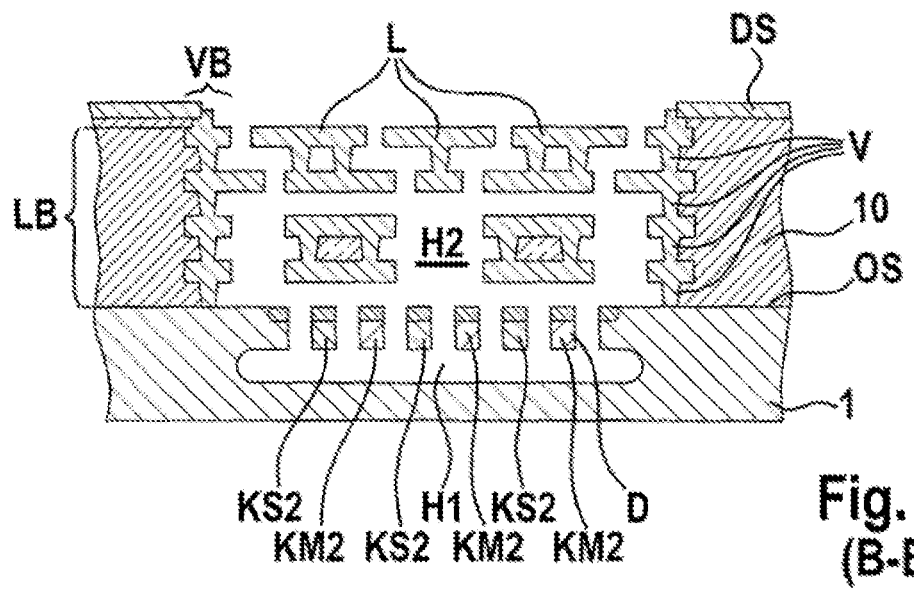

As illustrated in FIG. 2c), HF vapor phase etching is then carried out to expose the structures within the cavity H2.

Figure 2D:
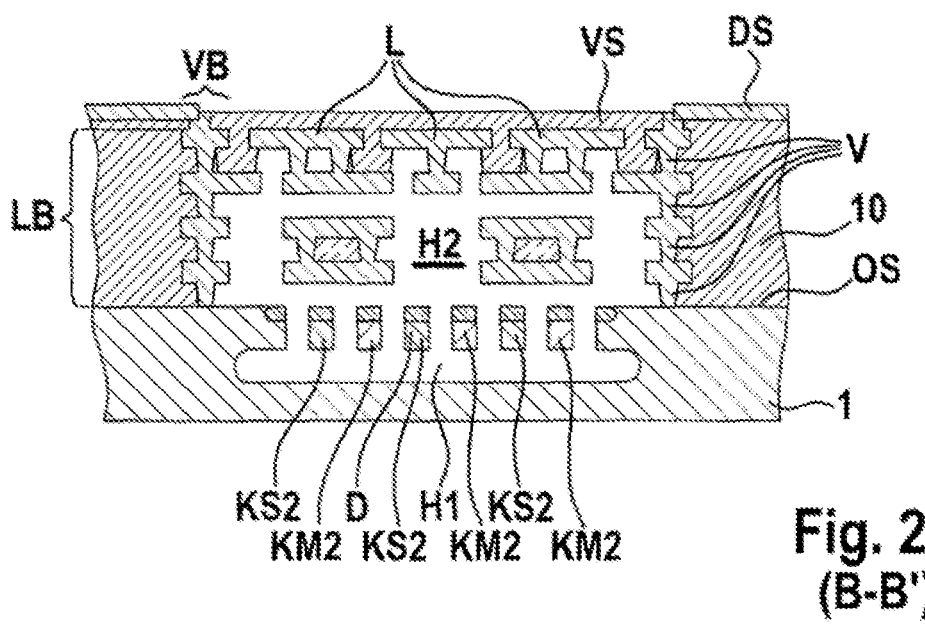

Finally, referring now to FIG. 2d), the closure layer VS is deposited using a sputtering or PECVD process at low temperatures and then patterned. A sputtering process is preferred if the closure layer VS is a metal layer, whereas a PECVD process is preferred if the closure layer VS is a dielectric layer. The process pressure used is enclosed within the joint cavity H1, H2.

The process for defining the micromechanical functionality can advantageously be added into a conventional CMOS process after the application of the front-end CMOS layers (doping, oxides, gate layer stack), wherein an insulation layer, for example a BPSG layer, and/or a metal layer, can be patterned in combination with the insulation layer as the etching mask for the etching process used to pattern the micromechanical functional region M, F, S1, S2.

Figure 3:
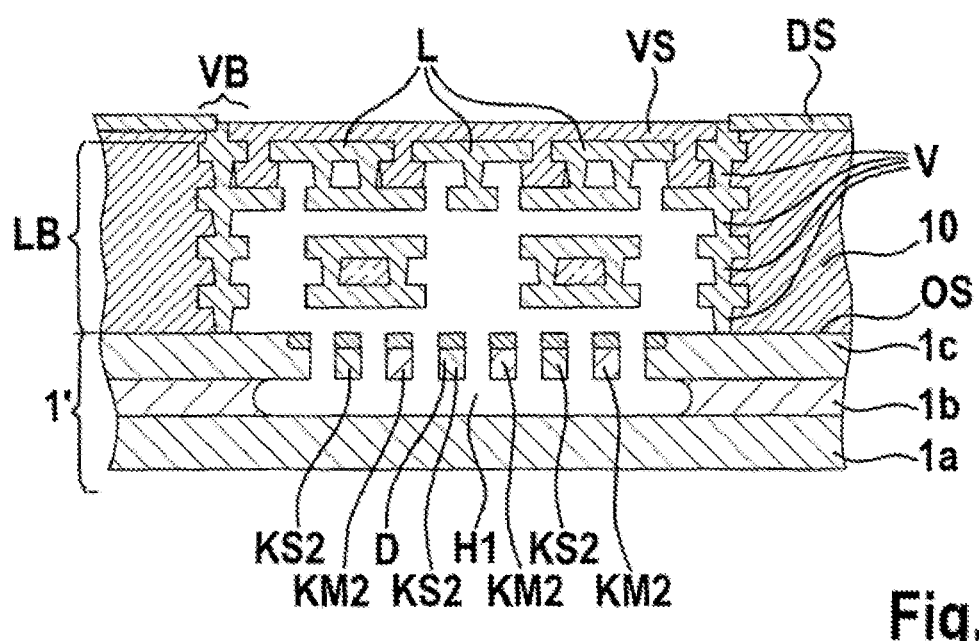

FIG. 3 is a schematic illustration of a micromechanical structure according to a second embodiment of the present disclosure in vertical section on line B-B' in FIG. 1a.

Figure 1C:
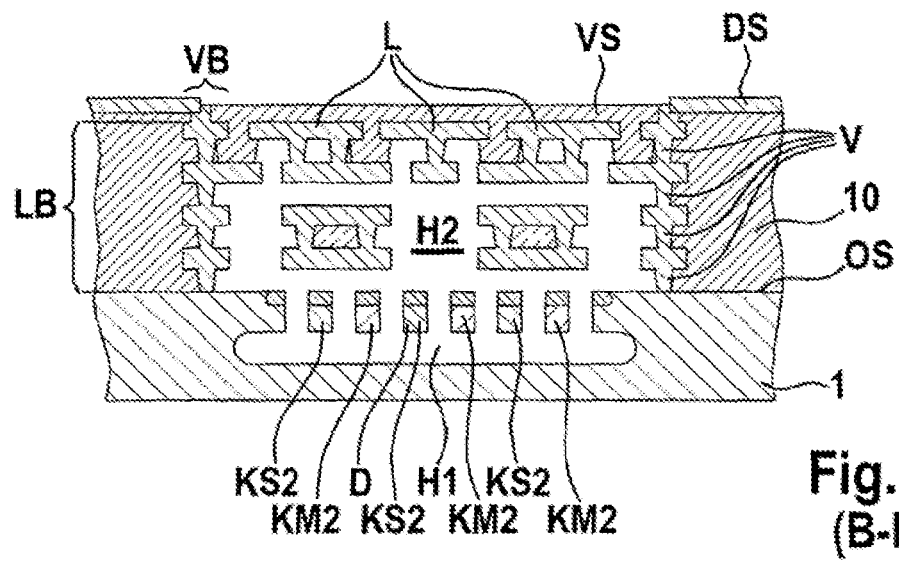

In FIG. 3, which is an analogous illustration to FIG. 1c), an SOI substrate 1', the top side of which is denoted by reference symbol OS', is provided instead of the single-crystal silicon substrate 1. The SOI substrate 1' has a lower single-crystal silicon layer 1a, a middle oxide layer 1b and an upper single-crystal silicon layer 1c.

The use of an SOI substrate 1' of this type offers the advantage that the height of the micromechanical functional structure M, F, S1, S2 formed by the second, single-crystal silicon layer 1c, can be very accurately defined by means of the buried oxide layer 1b.

Although the present disclosure has been described in full above with reference to preferred exemplary embodiments, it is not restricted to such embodiments, but rather can be modified in numerous ways.

Although the present disclosure has been explained with reference to micromechanical structures in the form of acceleration sensors, it is not restricted to structures of this type, but rather can in principle be applied to any desired micromechanical structures.

A further preferred example of the use of the micromechanical structure according to the disclosure is, for example, that of absolute pressure sensors.

What is claimed is:

1. A process for producing a micromechanical structure, comprising:
    applying and patterning an etching mask layer on a top side of a substrate;
    forming a micromechanical functional structure in the substrate through the top side via an etching process using access holes in the etching mask layer;
    closing the access holes in the etching mask layer;
    forming a conductor track arrangement above the formed micromechanical functional structure, wherein the conductor track arrangement is formed using at least two insulation layers of non-conductive material and a respective conductor track layer of conductive material located between each pair of the at least two insulation layers; and
    forming a cavity between a top capping layer and the top side of the substrate, wherein the top capping layer is over the conductor track arrangement, and wherein forming the cavity comprises removing the etching mask layer.

2. The process according to claim 1, wherein forming the conductor track arrangement further comprises laterally forming, with respect to the cavity, the conductor track arrangement such that the cavity is laterally delimited by the conductor track arrangement.

3. The process according to claim 2, wherein the conductor track arrangement is contiguous about the cavity.

4. The process according to claim 2, wherein the conductor track arrangement comprises a respective through-contact extending through each of the at least two insulation layers of non-conductive material.

5. The process according to claim 1, further comprising closing off the cavity with a closure layer.

6. A micromechanical structure, said micromechanical structure being prepared by a process including the steps of:
    applying and patterning an etching mask layer on a top side of a substrate;
    forming the micromechanical functional structure in the substrate through the top side via an etching process using access holes in the etching mask layer;
    closing the access holes in the etching mask layer;
    forming a conductor track arrangement above the formed micromechanical functional structure, wherein the conductor track arrangement is formed using at least two insulation layers of non-conductive material and a respective conductor track layer of conductive material located between each pair of the at least two insulation layers; and
    forming a cavity between a to capping layer and the top side of the substrate, wherein the top capping layer is over the conductor track arrangement, and wherein forming the cavity comprises removing the etching mask layer.

7. The micromechanical structure of claim 6, wherein forming the conductor track arrangement further includes laterally forming, with respect to the cavity, the conductor track arrangement such that the cavity is laterally delimited by the conductor track arrangement.

8. The micromechanical structure of claim 7, wherein the conductor track arrangement is contiguous about the cavity.

9. The micromechanical structure of claim 6, said process further includes the step of closing off the cavity with a closure layer.

* * * * *